Feb. 3, 1953 C. WASMANSDORFF 2,627,579

TUNABLE AMPLIFIER AND CONVERTER UNIT FOR RADIO APPARATUS

Filed March 8, 1949 4 Sheets-Sheet 1

Inventor:
Carlton Wasmansdorff,

By Homer R. Montague

ATTORNEY

Inventor:
Carlton Wasmansdorff,

By Homer R. Montague
ATTORNEY

Feb. 3, 1953 C. WASMANSDORFF 2,627,579

TUNABLE AMPLIFIER AND CONVERTER UNIT FOR RADIO APPARATUS

Filed March 8, 1949 4 Sheets-Sheet 3

Inventor:

Carlton Wasmansdorff,

By Homer R. Montague

ATTORNEY

TUNABLE AMPLIFIER AND CONVERTER UNIT FOR RADIO APPARATUS

Filed March 8, 1949 4 Sheets-Sheet 4

Inventor:
Carlton Wasmansdorff,

By Homer R. Montague

ATTORNEY

Patented Feb. 3, 1953 2,627,579

UNITED STATES PATENT OFFICE 2,627,579

TUNABLE AMPLIFIER AND CONVERTER UNIT FOR RADIO APPARATUS

Carlton Wasmansdorff, Los Angeles, Calif., assignor, by mesne assignments, to Standard Coil Products Co. Inc., a corporation of Illinois Application March 8, 1949, Serial No. 80,310

8 Claims. (Cl. 250—40)

Figure 1:
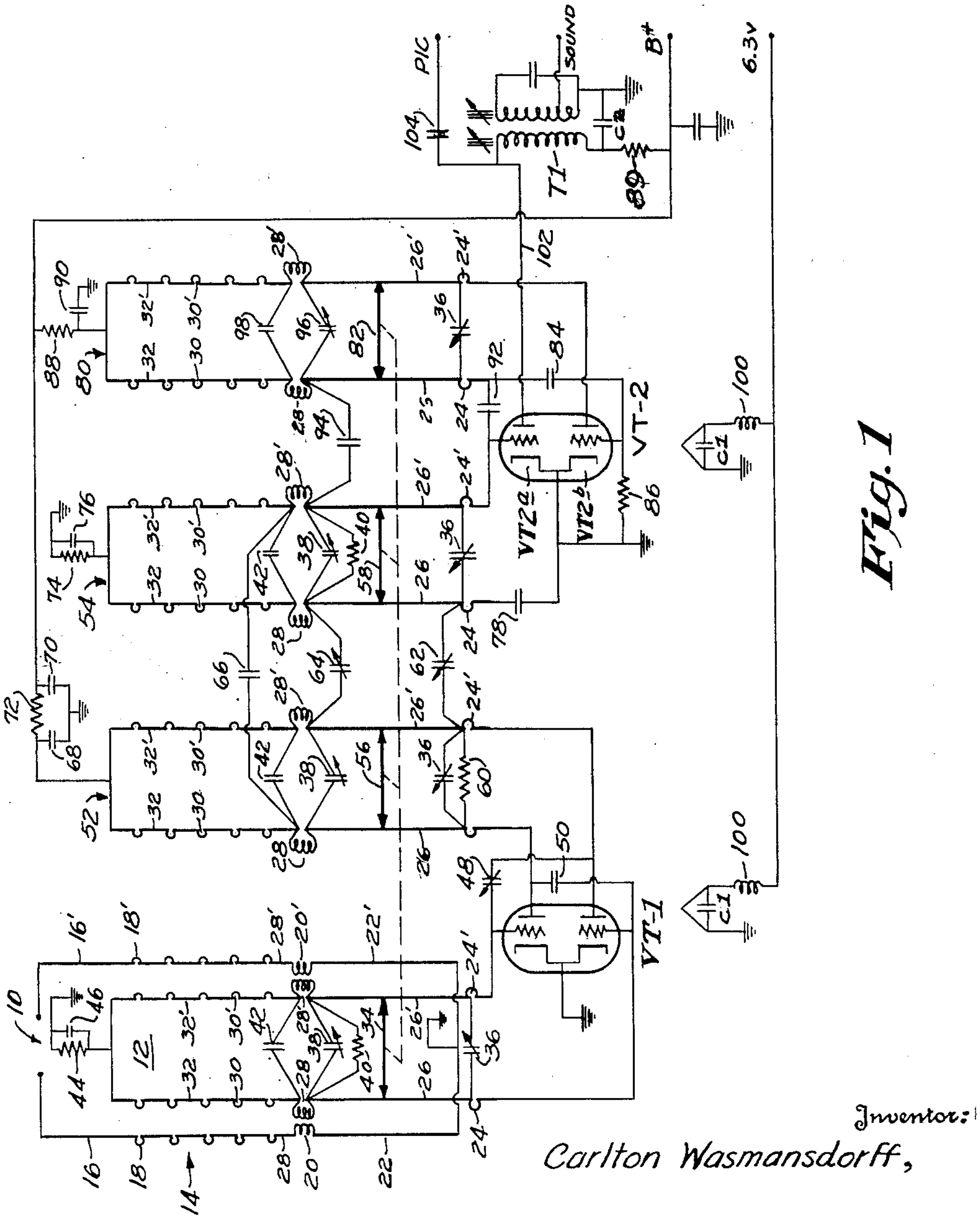

This invention relates in general to tuning units for electronic circuits of the type set forth in my co-pending application Serial 70,747, filed January 13, 1949, titled "Tunable Unit for Radio Apparatus." In that application I have described and illustrated in its basic form a tuning unit of which the present invention is an improvement.

In present forms of electronic equipment such as television receivers, signal generators, radio transmitter tuning units, band switching filters, etc., where it is desired that the equipment cover a large portion of the radio spectrum, it is necessary to utilize band-switching arrangements employing tuning coils or the like which are switched into the tuned circuits by means of rotary type switches. In my above mentioned co-pending application I have described a means by which it is possible to obviate the use of rotary switches and tuning coils with their inherent and obvious disadvantages in certain types of electronic equipment.

It is an object of my invention to provide a wide range electronic tuning unit which is compact, simple of construction, and which obviates the use of rotary switches and tuning coils.

It is another object of my invention to provide a wide range electronic tuning unit having band spread characteristics at selected portions of the range, and which permits rapid switching to select desired portions of the range without the use of rotary switches and tuning coils.

A further object of my invention is to provide a wide range tuning unit peculiarly advantageous for television receivers, which tuning unit is completely self-contained as to input radio frequency amplifier, intermediate frequency converter, and oscillator circuits, utilizing a tunable transmission line band switching and tuning mechanism which obviates the necessity of multi-contact rotary switches and tuning coils, cam-operated variable inductors, and the like.

Still another object of my invention is to provide a "front" or "head" end tuning unit for television receivers which is extremely compact, simple and economical of manufacture and which utilizes a tunable transmission line arrangement for band or channel switching and tuning.

Another object of my invention is to provide a wide band tuning unit capable of use with television receivers in which the band switching is accomplished by means of tuned transmission lines having a uniform "Q" of optimum value to provide a desired relationship between selectivity and band-pass characteristic.

A further object of my invention is the provision of a wide band tuning unit in which band or channel switching is accomplished by means of a plurality of tuned transmission lines whose "Q" can readily be controlled to desired values at various portions of the tuning range, to provide high gain and a desired band-pass characteristic at all points of such range.

A further object of my invention is the provision of a tuning unit that will permit all necessary adjustments for alignment to allow for production and tube variations without requiring extensive alignment adjustments, which unit utilizes tuned transmission lines instead of the conventional rotary switch and tuning coil arrangement, or variable core inductors or the like.

Another object of my invention is to provide a simple, compact, easily constructed "front" end unit for use with television receivers and the like in which the tuning of the radio frequency amplifier circuit, the intermediate frequency converter circuit, and the heterodyne oscillator circuit is accomplished by a simultaneous controlled variation in the inductance and capacitance defined by a pair of properly shaped and positioned plates for each circuit acting as a tuned transmission line, the portion thereof introduced in the circuit to be tuned being controlled by the motion of a rotatable shorting element, there being one such shorting element for each pair of plates.

Another object of my invention is to provide a tuning unit suitable for television receivers and the like utilizing a novel circuit comprising a push-pull tuned input circuit (inductively coupled from a transmission line) and feeding the grids of a push-pull, cross-neutralized radio frequency amplifier. The plate circuit of this amplifier is arranged to feed a tunable pi-section band pass filter, the overall combination of the input circuit, radio frequency amplifier and interstage pi-section filter forming an active band pass filter which is tunable to each channel. A novel combined vacuum tube mixer stage and high frequency oscillator, for example of the Colpitts type, are also provided to produce from the incoming R.-F. signal the desired constant intermediate frequency for further amplification.

A further object is to provide a tuning unit especially for television receivers in which the functions of channel selection and of fine tuning within each channel are accomplished by adjustment of a single tuning control rotatable through not more than a single revolution in covering all presently authorized U. S. television channels. Such arrangement permits an exceedingly simple and easily operable control or dial arrangement, as compared with known systems requiring separate adjustments for channel selection and fine tuning, or with other known systems in which a single adjustment control is required but which must make a plurality of revolutions for the same results.

Figure 2:
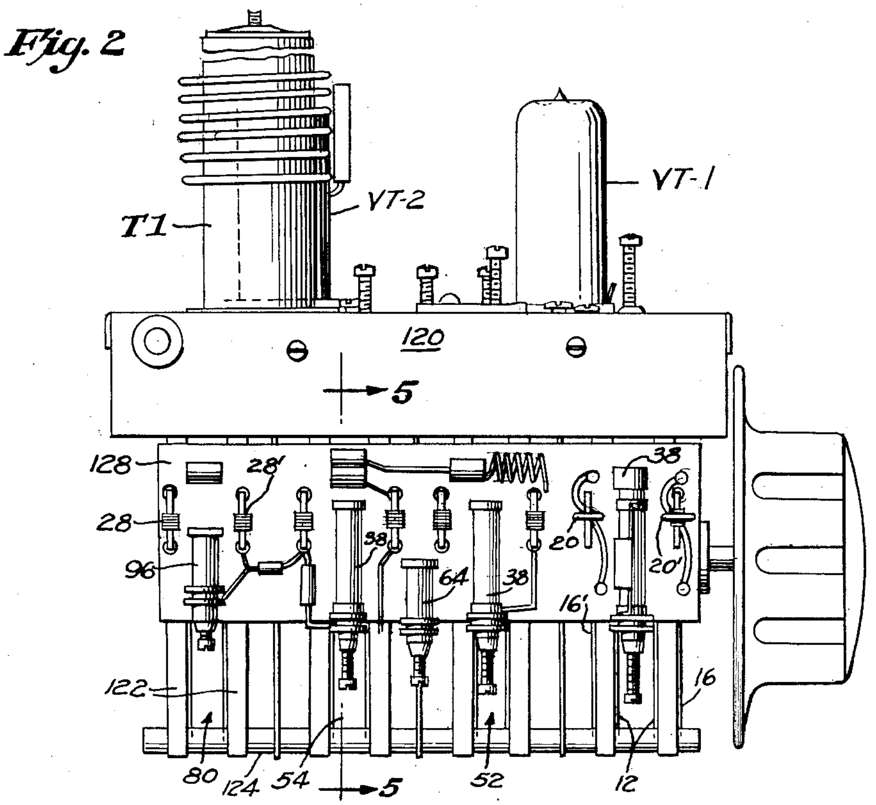
Figure 3:
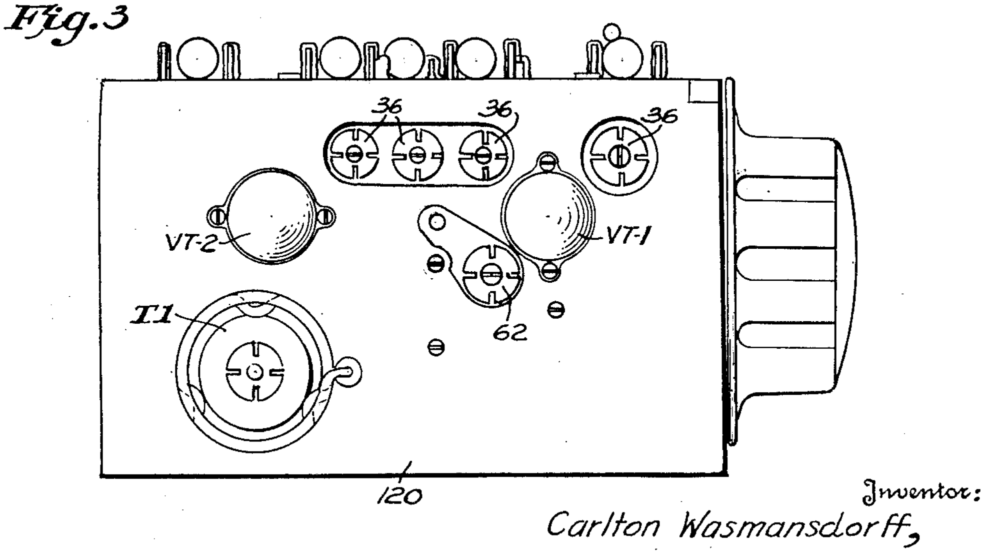
Figure 4:
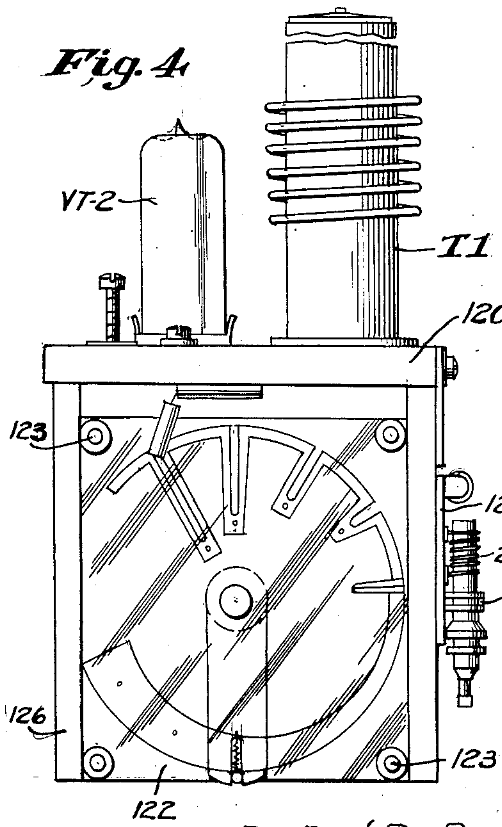
Figure 5:
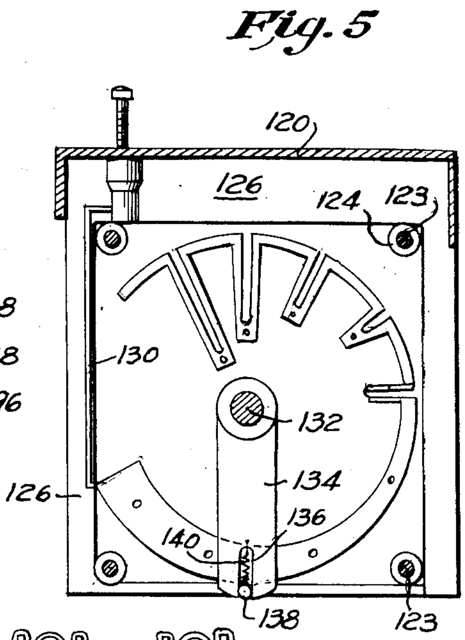
Figure 6:
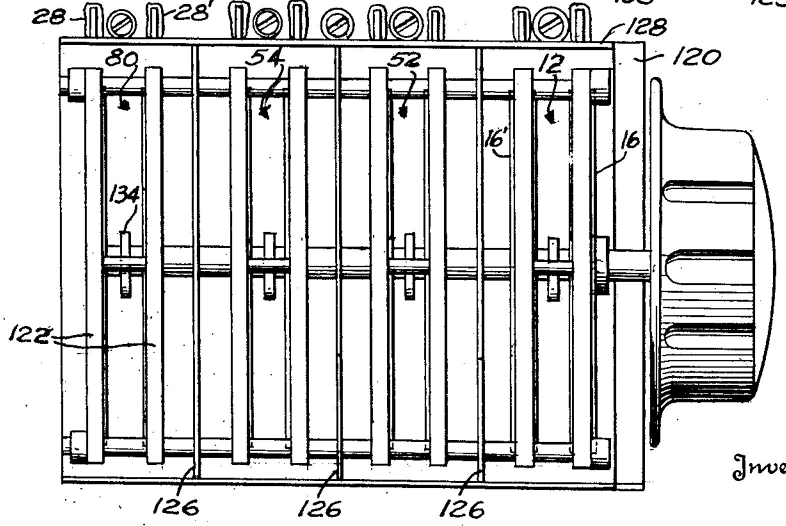
Figure 7:
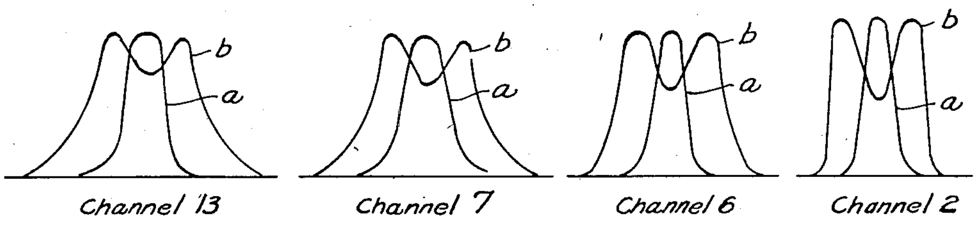
Figure 8:
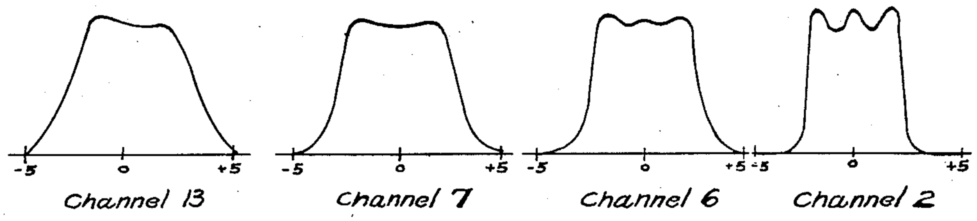

The above and other objects and advantages of my invention will best be understood in connection with a preferred and exemplary embodiment thereof, described hereinafter in connection with the appended drawings in which:

Fig. 1 is a schematic diagram of a complete tuning unit in accordance with the invention, Fig. 2 is a side elevational view of a mechanical embodiment of the tuning unit, Fig. 3 is a plan view of the tuning unit illustrated in Fig. 2, Fig. 4 is a rear view of the tuning unit illustrated in Fig. 2, Fig. 5 is a sectional view of the tuning unit taken along the cutting plane 5—5 of Fig. 2, Fig. 6 is a bottom view of the unit, Fig. 7 is a graphic representation of the approximate response characteristics for various channels in the grid of the R.-F. amplifier and of the interstage filter, and Fig. 8 is a similar representation of overall band pass characteristics of the unit.

Although I shall describe my invention as it is applied for use as a "head" or "front" end for television receivers, it is understood that the invention may be used as a tuning unit in other types of electronic equipment previously mentioned.

In general, my tuning unit has been so designed and arranged that the number of small components has been considerably reduced and the use of stamped, sprayed or printed inductors and tuning elements makes the unit suitable for low cost, mass production methods.

The tuning mechanism itself comprises a plurality of sets of folded transmission lines, each set of transmission lines being tuned by a shorting bar that contacts the outer periphery of the folded lines. The folded lines are constructed in accordance with the teachings of my co-pending application mentioned above so that the overall tuning range is encompassed by approximately 280° of angular rotation of the single control tuning dial, with the twelve presently authorized television channels being displaced from one another by approximately the same angular deviation of the tuning dial. The uniform "Q" and frequency stability of the tuning inductors permits excellent band pass characteristics as well as excellent alignment and tracking over both the higher and lower frequency bands.

My tuning unit permits all necessary adjustments for alignment to allow for production and tube variations without requiring extensive alignment adjustments. The inductance between the tube plate and the upper end of the tuning line sets the higher frequency on the high band. A trimmer capacitor on each of the sets of frequency ranges sets the low end of the high band. Once these two adjustments are made, the high band is on calibration. A variable capacitor in the pi-section allows accurate adjustment of the band width from approximately three to ten megacycles over the present television band.

In the schematic diagram of Fig. 1, for convenience of reference, each of the four tunable line sections of the device has been assigned a number which indicates such section as an entirety, while the component portions of each such line section have been assigned particular numbers. Since in the present embodiment each line section comprises two duplicate conductors spaced apart to form the tuned line by reason of inductance and capacitance existing between such conductors, the component portions of each conductor (including auxiliary trimmer inductors arranged in series with each conductor) have been designated by numbers either with or without a prime depending upon that one of the conductors with which it is associated.

The composite radio frequency present at the antenna terminals 10 is fed to the first tunable line 12 by a balanced loop 14 formed of conductors paralleling the two conductors of line 12 and provided with a fixed grounded short at the end remote from the antenna terminals. The mechanical arrangement of these parts is only schematically indicated in Fig. 1, but will be detailed in connection with succeeding figures. The balanced loop 14 is formed of inductance portions 16, 16′, inductance loops 18, 18′, lumped inductances 20, 20′ and line inductance portions 22, 22′. This loop is both inductively and capacitively coupled to the first tunable line 12, which is formed of inductances 24, 24′, line inductance portions 26, 26′, lumped inductances 28, 28′ (coupled to the lumped inductances 20, 20′), inductance loops 30, 30′ and shortable inductance line portions 32, 32′. Inductances 24, 24′ establish the resonant frequency of that portion of tunable line 12 included below the shorting bar 34 when the tuning dial is at the channel 13 position. Other intermediate positions of the shorting bar as it is moved progressively up the length of tunable line inductance portions 26, 26′ will select the proper resonant frequency for the remaining channels (12, 11, 10, 9, 8 and 7) in the higher frequency television band (e. g., from 216 to 174 megacycles). A capacitance 36 connected across the line 12 just above inductances 24, 24′ cooperates with the line inductance in establishing the resonant frequency for channel 7. As the tuning dial is moved from channel 7 position to channel 6 position, the shorting bar 34 skips across the lumped inductances 28, 28′, thus lowering the resonant frequency of the line by a substantial amount, and the shunt capacitance 38 establishes (in connection with inductances 28, 28′) the resonant frequency of the remaining portion of the tuned line 12 included by shorting bar 34, to the proper frequency for channel 6. A resistor 40 shunted across the line at the point of connection of capacitance 38 provides sufficient damping of the resonant circuit for the lower frequency channels to maintain a proper channel bandwidth at these lower frequencies, this being necessary because of the inherently high "Q" of the construction used.

As the shorting bar 34 progresses on up the length of the line 12 and successively shorts the inductance line portions 32, 32′, the resonant frequency of the line will be altered to correspond to the frequencies of the remaining channels (5, 4, 3, 2 and 1, if employed) in the lower frequency television band (e. g., from 88 to 44 megacycles). Inductance loops 30, 30′, positioned between the shortable line sections 32, 32′, cause the midchannel frequency to fall at substantially the midpoint of each shortable section, thus providing fine tuning of the channel by slight adjustments of the shorting bar to either side of such midpoint, by manipulation of the same control which provides the coarse (or channel-selecting) adjustment. A shunt capacitance 42 establishes the resonant frequency for the lower frequency channel used, in accordance with principles explained in the prior application referred to above. The common ground return of this tunable line is through biasing resistor 44 shunted by a small stabilizing capacitor 46.

The tuned line 12 feeds the grids of a dual triode VT1 (which may be an RCA type 6J6, for example) which is adjustably cross-neutralized by capacitors 48 and 50 from each grid to the opposite plate, this neutralization providing (1) absence of regeneration, thus permitting maximum gain from the stage, and (2) proper balance of the push-pull arrangement, to minimize the amount of local oscillator signal fed back to the antenna where it might be radiated to cause interference with other receivers.

The signal output from the plates of tube VT1 is fed directly to a second tunable line section 52, whose construction is quite similar to that of line 12, and whose common components have therefore been given the same numerical designations. A third tunable line section, to which the same remark applies, is designated generally by numeral 54, and is capacitively coupled to line 52, the combination providing a tunable pi filter section. The shorting bars of these lines, which are designated 56 and 58, are ganged with the shorting bar 34 of the first tunable line. A damping resistor 60 is connected across the terminating capacitor 36 of line 52 to provide damping at all resonant frequencies, and the degree of damping is more severe than that provided in the low frequency portion of the first tuned line 12, because resistor 60 has a substantially lower value of resistance than does resistor 40. This arrangement is adopted to accomplish the steep skirted over-all radio frequency amplifier response characteristics in Fig. 8. The representative over-all band pass characteristics are obtained, in each case, from a combination of the approximate response characteristics (*a*) of the tuning circuit on the grid side of the radio frequency amplifier tube VT1 and (*b*) of the interstage pi filter section between tubes VT1 and VT2. The latter characteristics are shown in Fig. 7. In connection with the input tuned circuit response characteristics (*a*), it should be noted that since this circuit is tuned to the center of the respective channel band and the "Q" is held to quite high values, maximum protection from unwanted signals to either side of the desired carrier is afforded the grids of the radio frequency amplifier tube VT1.

Coupling capacitors 62, 64 and 64 are shunted across corresponding portions of the second and third tuned lines 52 and 54 to provide the desired pi filter section, and these may also provide a degree of fine adjustment of the band width response characteristics. Since the magnitude of the required coupling capacitance increases as the resonant frequency is decreased, capacitance 62 is employed to set the band width characteristic for the higher television frequencies, and excursion of shorting strips 56 and 58 into the low frequency section of the tuned lines 52 and 54 accomplishes insertion of coupling capacitance 64, which is effective in adjusting the bandwidth characteristics in the high frequency end of the low frequency band, and capacitance 66 which becomes most effective in the low frequency end of the low frequency band. The only remaining difference between the circuitry directly associated with the first and second tuned lines, not yet touched upon, is the ground return circuit of the second tuned line. It will be noted from Fig. 1 that this consists of a pi section filter formed by capacitances 68 and 70 and resistance 72. This filter serves the purpose of providing radio frequency isolation between the radio frequency plate supply and oscillator plate supply circuits.

An ingenious method is utilized in the third tuned line 54 to match its balanced configuration to the single ended input of the single triode mixer section VT2*a* of vacuum tube VT2. Biasing of the triode VT2*a* is accomplished thru high resistance 74 shunted by a small stabilizing capacitance 76. It will be noted that one side of the third tuned line 54 connects directly to the grid of the mixer triode VT2*a*, whereas the other side of the tuned line is coupled to ground by balancing capacitance 78, thus effecting conversion from balanced to single-ended operation.

The fourth tuned line 80 is operated in conjunction with the other triode section VT2*b* of vacuum tube VT2 as a single ended Colpitts oscillator, the plate circuit inductance consisting of the inductance of that portion of the fourth tuned line included by shorting strip 82, whereas the portion thereof consisting of the included portions of one side of the tuned lines 24, 26, 28, 30 and 32 constitutes the grid feed-back source for the oscillator triode section VT2*b*. This grid feed-back voltage is coupled to the oscillator triode VT2*b* grid thru capacitance 84, across ground return resistance 86. Oscillator plate voltage is supplied thru filter combination resistance 88 and capacitance 90. Injection of oscillator voltage to the mixer triode VT2*a* is accomplished by capacitance coupling between the oscillator feed-back side of the fourth tuned line and the grid of the mixer tube VT2*a*. Capacitance 92 provides this coupling throughout the range of the high frequency band, whereas additional coupling is provided by capacitance 94 throughout the range of the low frequency portion of the television band.

The design and adjustment of the fourth tuned line differs from the first, second and third tuned lines only in that the constants of its various inductive elements must be so chosen as to produce the proper intermediate frequency at the output of the mixer tube VT2*a* thru heterodyne action within this mixer tube. Here again, as in the other three tuned lines, calibration is accomplished by adjusting inductances 24 and 24' for channel 13, capacitance 36 for channel 7, capacitance 96 for channel 6, and capacitance 98 for the lowest channel in the low frequency band.

The cathode heaters for vacuum tubes VT1 and VT2 are supplied with usual heater current through radio frequency chokes 100 in a known manner, and the heterodyne output from the mixer section VT2*a* passes over a lead 102 to provide the desired picture signal through a coupling capacitor 104, and the desired sound signal through a conventional converter transformer T1. The converter transformer is a combination picture I.-F. transformer, sound trap and sound I.-F. transformer in which the converter plate coil is located physically within a high Q resonant circuit tuned to the sound I.-F. This high Q circuit absorbs the sound I.-F. component from the primary of the transformer, in a manner well known to those skilled in the art, providing separate picture and sound I.-F. signals from the composite heterodyne signal supplied from the tuner.

With the above explanation of the electrical principles of the invention in mind, there will now be described in some detail a preferred mechanical embodiment of the invention presenting numerous novel features of construction and arrangement which enable the improved tuning unit to be manufactured economically and in a configuration which renders the same interchangeable with prior art tuning units (particularly in known types of television receivers), and which mechanical arrangement contributes greatly to the accuracy, stability and proper functioning of the apparatus.

As illustrated in Figs. 2 to 6 of the drawings, the tuning unit is desirably provided with a top chassis plate 120 on which are mounted the vacuum tubes VT1 and VT2, and the I.-F. transformer T1 and the trimmer capacitors 36 and 62 described above. Depending below the chassis plate 120 is the tunable line assembly comprising the balanced loop conductors 16 and 16' and the tunable lines 12, 52, 54 and 60. As shown in Figs. 2 and 6, the two conductors which make up the tunable line 12 are mounted upon the facing surfaces of two plastic or insulating plates 122, the outer face of each of which has mounted thereon one of the spaced conductors 16, 16' forming the balanced antenna-coupling line. Each of these conductors 16, 16' is thus inductively and capacitively related to one of the arcuate conductors of the tunable line 12. The arcuate conductors forming the remaining three tunable lines 52, 54 and 60 are similarly mounted in paired relationship upon the facing surfaces of identical insulating or plastic plates 122, all of such plates being rigidly mounted in spaced relation to one another by means of transverse rods 123 carrying spacers or bushings 124 (see Fig. 5), the rods 123 passing through suitable apertures in the plates and being provided at their opposite ends with headed portions and threaded nuts by means of which the plates are held in the desired relationship.

For purposes of providing shielding between adjacent tunable line units, a series of three metallic plates 126 are provided, with one such plate lying between each two adjacent line units, said plates also being suitably apertured for the passage of the rods 123. At their upper edges plates 126 are secured to the underside of the chassis plate 120 or to metallic skirts depending therefrom, whereby to maintain the chassis plate 120 and the tunable line assembly in the desired compact relation. Along one side of the unit, and suitably secured in any desired manner to the lateral edges of plates 126, there is provided a chassis panel 128 of suitable insulating material upon which are mounted the lumped inductances 28 and 28' corresponding to each of the tunable lines, each of these inductances being formed of a few turns of wire wound upon an insulating card or bobbin. The leads from each inductance 28, 28' pass rearwardly through suitable holes in the panel 128, and it will be observed from Figs. 4 and 5 that this arrangement enables the use of very short connecting leads to connect each of the lumped inductances in series with the two halves of each circular or folded line conductor. The lumped inductances 20, 20' may comprise a single turn of wire wound about the lumped inductances 28, 28' corresponding to the first tuned line 12, and their terminal leads may pass rearwardly through panel 128 for connection in series with the midpoints of conductors 16 and 16'.

The trimmer capacitors 38, 64 and 96, which were described above in connection with the schematic diagram, are likewise mounted upon panel 128 in locations where they may be connected across the midpoints of the tunable lines by short connecting leads which pass through the panel 128. On the other hand, the trimmers 36 and 62 which correspond with the respective tunable lines at those ends representing maximum frequency (said trimmers being mounted upon the chassis plate 120) are readily connected to the tunable lines as by leads 130, indicated diagrammatically in Fig. 5. These leads 130 may comprise parallel conductors of such length as to supply by inherent self-inductance the inductances indicated in Fig. 1 by numerals 24 and 24' and to this end each conductor 130 may pass along a lateral edge of one of the insulating plates 122.

Each of the substantially square insulating plates 122 and the metallic shield plates 126 is preferably provided with a centrally located aperture through which passes a control shaft 132 which may be of insulating material, and between each pair of plates 122 this shaft 132 carries an insulating arm 134, having its outer end extending somewhat beyond the arcuate conductors forming the tunable lines. As best shown in Fig. 5, each of the arms 132 is slotted inwardly as at 136 to accommodate a contact pin 138 arranged to bridge across the conductors constituting each of the tunable lines, and thereby to short circuit the same at an angular position determined by the rotation of shaft 132. To maintain a contact between metallic pin 138 and the periphery of each conductor, the pin may be biased inwardly within slot 136 by a small spiral spring 140 secured at one end to said pin and at the other to a relatively inward point on arm 134. Also, if desired the facing surfaces of each of the plates 122 may be slightly cut away in the areas lying outside the periphery of each tunable line conductor, the portion of said plate directly underlying each such conductor being slightly undercut if desired to prevent holding the pin 138 out of contact with the peripheral edge thereof.

The manner in which the folded conductors which make up the individual tunable lines are mounted is, of course, subject to wide variation. As shown in the drawings, each of these conductive strips (such as the strips making up line 12) is provided with small spaced holes, so that when the strips are pressed against their supporting plastic plates with the application of heat, a portion of the plastic may run through the apertures and secure the conductors in fixed position. Alternatively, cement may be applied through these small apertures, or the conductor strips may be secured to the plastic insulating support plates by rivets or other fastening means. The conductive strips may equally well be applied to insulating supporting layers by spraying, plating or in various other ways well known to the art. Also, as pointed out in the prior application referred to above, it is not essential that the inductive loops between portions of the conductors defining the low frequency channels extend inwardly from the periphery of the folded transmission line, since these loops may equally well extend outwardly from said periphery or even laterally therefrom. In such cases, the movable shorting bar may be arranged to contact the inner periphery of a circular ring or other appropriate mechanical arrangement may be applied. It is also to be understood that the control shaft 132 may be driven from various types of controls other than the simple knob shown in the drawings, where vernier control for fine tuning is desired.

Those circuit components shown in Fig. 1 which are directly associated with the vacuum tubes VT1 and VT2 (for example, the neutralizing capacitors and the like) may conveniently be mounted beneath the main chassis plate 120, (although other disposition of such elements is not to be deemed excluded from the possible mechanical arrangements falling within the present invention. It is also to be understood that the number of separate channels into which the desired tuning range is divided will depend upon the application of the device. The preferred mechanical embodiments illustrated in the drawings, for example in Fig. 5, provides for five low frequency television channels (that is, channels 2 to 6, inclusive, of those presently authorized). However, as illustrated diagrammatically in Fig. 1, the number of separate channels, and the number of lumped inductances located therebetween, may be made as large as desired: in Fig. 1, six such low frequency channels are illustrated merely by way of example.

A tuning unit constructed in accordance with the above disclosure has been found to satisfy the requirements of apparatus of this type in a most satisfactory manner. The overall sensitivity of the unit is of the order of 30–100 microvolts as compared with sensitivities as low as 400 microvolts in commercial prior art devices intended to accomplish the same functions. The neutralization is positive and accurate, completely eliminating regeneration at all points, and the unit is completely free from spurious responses. Image rejection is at a maximum for single stage radio frequency amplifiers operating at conventional frequencies, and selectivity is quite superior. For purposes of example, the following tabulation of the values of various components utilized in an actual embodiment of the invention is supplied, but it is to be understood that these may be varied without departing from the present invention:

| | |
|---|---|
| Resistors: | |
| 40 | 10,000 ohms. |
| 44 | 500,000 ohms. |
| 60 | 5,000 ohms. |
| 72 | 2,200 ohms. |
| 74 | 1 megohm. |
| 86 | 100,000 ohms. |
| 88 | 1,500 ohms. |
| 89 | 4,700 ohms. |
| Capacitors: | |
| 36, 48, 62, 64, 96 | 3.5 mmf. |
| 38, 94 | 8.0 mmf. |
| 42, 66 | 22 mmf. |
| 46, 76, 84, 98 | 10 mmf. |
| 50, 92 | 1.5 mmf. |
| 68 | 50 mmf. |
| 70, C1, C2 | 1,000 mmf. |
| 78 | 5 mmf. |
| 90 | 32 mmf. |
| 104 | 220 mmf. |
| Inductors: | |
| 100 | 12 turns #20 wire. |
| Tubes: | |
| VT1, VT2 | RMA-6J6. |

There has been described herein the detailed construction of a particular and preferred physical embodiment of the invention which has been found very satisfactory in actual tests, but it is to be understood that the details of construction and arrangement may be widely varied by those skilled in this art without departing from the spirit of the invention as defined in the appended claims.

What is claimed is:

1. A wide band tuning unit comprising a plurality of pairs of conductors, each of said conductors being arranged in substantially circular configuration, means for mounting said conductors in spaced parallel planes perpendicular to a common central axis, lumped inductances interposed in series with successive portions of each conductor at spaced points along its length, a separate movably mounted shorting element supported for contact with both conductors of each pair of conductors, and means for simultaneously moving all of said shorting elements about said axis to short-circuit the conductors of each pair to one another at various positions along their lengths.

2. A unit for television receivers and the like comprising radio frequency amplifier, intermediate frequency converter, and oscillator circuits, means for tuning said circuits, said means including a pair of tuned parallel conductors for each of said circuits, means for supporting all of said conductors in parallel planes, each of said conductors having concentric portions of circular configuration and inductance controlling elements connected in series between successive concentric portions of each of said conductors, capacitance controlling elements shunting each pair of said conductors at spaced points, individual means for shorting across concentric portions of each pair of conductors, and means for simultaneously moving all of said shorting means along their respective pairs of conductors.

3. A tuning unit for television receivers and the like comprising a chassis, a plurality of pairs of dielectric sheets mounted beneath said chassis and depending therefrom, a flat conductor of substantially circular configuration mounted on the facing surfaces of each pair of dielectric sheets, rotatable means for shorting across each pair of the conductors mounted on said dielectric sheets, and means for simultaneously adjusting all of said movable shorting means.

4. A wide band, tunable band pass filter comprising a pair of folded circular transmission lines, capacitance means coupling each conductor of one transmission line to a respective conductor of the other transmission line, and rotatable means for concomitantly adjusting the effective lengths of both of said transmission lines.

5. The invention in accordance with claim 4 in which each conductor of each of said transmission lines comprises spaced concentric arcuate portions and lumped inductance portions connected therebetween at spaced points along said conductor.

6. The invention in accordance with claim 4 including adjustable capacitance elements bridged across portions of each of said transmission lines for controlling the maximum tunable frequencies of said portions.

7. A wide-band tuning unit comprising a pair of spaced parallel plates of insulating material, each of said plates carrying on the surface facing the other plate a conductive strip comprising arcuate portions disposed about a common axis and having their outer edges concentric therewith, lumped inductance elements connected to the adjacent ends of successive arcuate portions of said strip, a shorting element mounted for rotation between said sheets for rotation about said axis and arranged to engage the outer edges only of said arcuate portions, and means for rotating said shorting element about said axis.

8. The invention in accordance with claim 7, including conductor means electrically connected to one end of said strips, said shorting element being devoid of electrical connection other than to said strips.

CARLTON WASMANSDORFF.

REFERENCES CITED

The following references are of record in the file of this patent:

UNITED STATES PATENTS

| Number | Name | Date |
|---|---|---|
| 2,066,674 | Dunmore et al. | Jan. 5, 1937 |
| 2,113,961 | Hotopp, Jr. | Apr. 12, 1938 |
| 2,126,541 | De Forest | Aug. 9, 1938 |
| 2,175,710 | Usselman et al. | Oct. 10, 1939 |
| 2,244,807 | Schrumpf | June 10, 1941 |
| 2,246,928 | Schick | June 24, 1941 |
| 2,252,458 | Conklin et al. | Aug. 12, 1941 |
| 2,408,896 | Turner | Oct. 8, 1946 |
| 2,415,141 | Malling | Feb. 4, 1947 |
| 2,453,489 | Bruntil et al. | Nov. 9, 1948 |

OTHER REFERENCES

RCA Victor Television Receiver Model 630 TS, Service Data by RCA Victor Division, July 16, 1947.